US009912266B2

(12) United States Patent
Marvin et al.

(10) Patent No.: US 9,912,266 B2
(45) Date of Patent: Mar. 6, 2018

(54) MOTOR TORQUE RIPPLE REDUCTION USING DC BUS HARMONICS

(71) Applicant: Otis Elevator Company, Farmington, CT (US)

(72) Inventors: Daryl J. Marvin, Farmington, CT (US); Zhenhong Li, New Britain, CT (US)

(73) Assignee: OTIS ELEVATOR COMPANY, Farmington, CT (US)

( * ) Notice: Subject to any disclaimer, the term of this patent is extended or adjusted under 35 U.S.C. 154(b) by 0 days.

(21) Appl. No.: 15/226,220

(22) Filed: Aug. 2, 2016

(65) Prior Publication Data

US 2018/0041147 A1    Feb. 8, 2018

(51) Int. Cl.
*H02P 6/10* (2006.01)
*H02P 6/34* (2016.01)
*H02P 6/14* (2016.01)
*H02P 27/06* (2006.01)

(52) U.S. Cl.
CPC ............... *H02P 6/10* (2013.01); *H02P 6/14* (2013.01); *H02P 6/34* (2016.02); *H02P 27/06* (2013.01)

(58) Field of Classification Search
CPC .... H02P 6/10; H02P 29/50; H02P 3/00; H02P 5/00; H02P 7/00; H02P 21/00; H02P 27/04; H02P 27/06
USPC ......... 318/400.01, 400.02, 400.14, 700, 701, 318/727, 779, 799, 800, 801, 430, 432, 318/400.21, 400.22, 400.23; 363/21.1, 363/40, 44, 95, 120, 174, 175
See application file for complete search history.

(56) References Cited

U.S. PATENT DOCUMENTS

| 5,404,418 A | 4/1995 | Nagano |
| 6,313,602 B1 | 11/2001 | Arefeen et al. |
| 6,380,658 B1 | 4/2002 | Sebastian et al. |
| 6,426,602 B1 * | 7/2002 | McCann ................ B62D 5/046 318/284 |
| 7,099,165 B1 | 8/2006 | Rozman |
| 7,629,764 B2 | 12/2009 | Shoemaker et al. |

(Continued)

FOREIGN PATENT DOCUMENTS

| CN | 102361433 A | 2/2012 |
| CN | 104158447 A | 11/2014 |

(Continued)

OTHER PUBLICATIONS

Gómez-Espinosa et al., A New Adaptive Self-Tuning Fourier Coefficients Algorithm for Periodic Torque Ripple Minimization in PermanentMagnet Synchronous Motors (PMSM), Sensors 2013, 13, 3831-3847. (17 pgs).

(Continued)

*Primary Examiner* — Antony M Paul
(74) *Attorney, Agent, or Firm* — Cantor Colburn LLP

(57) ABSTRACT

A method and system of reducing/eliminating ripple in an electric motor. An electric parameter, such as current is sensed in an input electric signal. Ripple is detected in the signal using one or more current sensors and a discrete Fourier transform calculation. Ripple is reduced by adjusting the electric signal being sent from a drive control to an electric motor, using a closed-loop configuration. The electric motor might be a regenerative electric motor that is configured to sink or supply electricity to a power grid.

18 Claims, 3 Drawing Sheets

(56) References Cited

U.S. PATENT DOCUMENTS

| | | | |
|---|---|---|---|
| 8,169,172 B2 | 5/2012 | Markunas et al. | |
| 8,704,469 B2* | 4/2014 | Tadano | H02P 21/05 |
| | | | 318/400.02 |
| 8,847,591 B2 | 9/2014 | Fukui | |
| 8,890,519 B2 | 11/2014 | Klein | |
| 8,971,066 B2 | 3/2015 | Oi et al. | |
| 8,982,587 B2 | 3/2015 | Nguyen et al. | |
| 9,236,820 B2 | 1/2016 | Mikail et al. | |
| 2013/0099707 A1* | 4/2013 | Okubo | B62D 5/046 |
| | | | 318/400.23 |
| 2014/0145655 A1 | 5/2014 | Peretti et al. | |
| 2014/0253109 A1 | 9/2014 | Singh et al. | |
| 2014/0285124 A1 | 9/2014 | Derammelaere et al. | |
| 2014/0333247 A1 | 11/2014 | Freeman | |
| 2015/0333670 A1* | 11/2015 | Nakajima | H02P 6/10 |
| | | | 318/400.02 |
| 2016/0111986 A1 | 4/2016 | Vollmer et al. | |
| 2016/0344314 A1* | 11/2016 | Akimatsu | H02P 6/10 |

FOREIGN PATENT DOCUMENTS

| | | |
|---|---|---|
| CN | 104852661 A | 8/2015 |
| EP | 1067391 A1 | 1/2001 |
| EP | 1396927 A1 | 3/2004 |
| EP | 2164164 A1 | 3/2010 |
| EP | 2667503 A1 | 11/2013 |
| WO | 2013/038176 A2 | 3/2013 |
| WO | 2014039846 A2 | 3/2014 |

OTHER PUBLICATIONS

Stefan Brock et al., A Practical Approach to Compensation of Torque Ripple in High-Precision Permanent Magnet Motor Drives. International Conference on Electrical Drives and Power Electronics, Sep. 26-28, 2005, Dubrovnik, Croatia ISBN 953-6037.

EP Extended Search Report; Application No. EP 17184210.7; Dated Dec. 19, 2017; 9 pages.

* cited by examiner

MOTOR TORQUE RIPPLE REDUCTION USING DC BUS HARMONICS

BACKGROUND

The present disclosure relates in general to electric motors. More specifically, this relates to the reduction of torque ripple in an electric motor.

Electric motors are used in many different applications. Existing electric motors can suffer from undesirable harmonics that effect the operation of the electric motor. There are various different causes of harmonics. For example, offset and gain error in current measurement separately causes the first and second harmonic in the drive and motor system. The amplitude and spatial error in the motor construction and the imbalance in the utility power system can both contribute to sixth harmonics. The result of harmonics can create torque ripple, which can be detrimental to the object being driven by the electric motor, causing unevenness in the object being driven. In essence, torque ripple is a variation in the torque being provided by an electrical motor. Torque ripple can be particular objectionable when people are being driven by electric motors, such as in vehicles, elevators, escalators, and the like, especially in situations in which the variations can be amplified by the device being driven.

SUMMARY

According to one embodiment, a method includes sensing an electric parameter of an input electric signal; detecting a ripple in an AC component of the electric parameter; determining a correction to reduce the ripple in the AC component; and applying the correction to an electric signal supplied to an electric motor to reduce torque ripple.

In addition to one or more of the features described above, or as an alternative, further embodiments may include wherein: the electric parameter is chosen from current, voltage, or power.

In addition to one or more of the features described above, or as an alternative, further embodiments may include detecting the ripple comprises using a discrete Fourier transform on the input electric signal to detect a non-zero result.

In addition to one or more of the features described above, or as an alternative, further embodiments may include analyzing the electric signal supplied to the electric motor to create a closed-loop control that reduces the ripple to zero.

In addition to one or more of the features described above, or as an alternative, further embodiments may include wherein the electric signal supplied to the electric motor comprises a three-phase AC signal; and analyzing the electric signal supplied to the electric motor comprises measuring current in at least two of the three-phases of the three-phase AC signal.

In addition to one or more of the features described above, or as an alternative, further embodiments may include wherein: the input electric signal is a DC electric signal; and sensing the electric parameter comprises sensing an AC component in the DC electric signal.

In addition to one or more of the features described above, or as an alternative, further embodiments may include wherein: sensing the AC component in the DC signal comprises using a current sensor optimized to detect a non-zero AC component in the DC signal.

According to one embodiment, a system includes a DC power input; an inverter arranged to convert the DC power input to a three-phase AC power; a drive control coupled to the inverter; and an electric motor coupled to the drive control; wherein: the drive control is arranged to perform: sensing an electric parameter of the DC power input; detecting a ripple in an AC component of the electric parameter; determining a correction to reduce the ripple in the AC component; and applying the correction to an electric signal supplied to the electric motor to reduce torque ripple.

In addition to one or more of the features described above, or as an alternative, further embodiments may include wherein: the electric parameter is chosen from current, voltage, or power.

In addition to one or more of the features described above, or as an alternative, further embodiments may include wherein: detecting the ripple comprises using a discrete Fourier transform on the input electric signal to detect a non-zero result.

In addition to one or more of the features described above, or as an alternative, further embodiments may include wherein the drive control is further arranged to perform: analyzing the electric signal supplied to the electric motor to create a closed-loop control that reduces the ripple to zero.

In addition to one or more of the features described above, or as an alternative, further embodiments may include wherein the electric signal supplied to the electric motor comprises a three-phase AC signal; and the analyzing the electric signal supplied to the electric motor comprises measuring current in at least two of the three-phases of the three-phase AC signal.

In addition to one or more of the features described above, or as an alternative, further embodiments may include wherein: the input electric signal is a DC electric signal; the sensing the electric parameter comprises sensing an AC component in the DC electric signal.

In addition to one or more of the features described above, or as an alternative, further embodiments may include wherein: the sensing the AC component in the DC signal comprises using a current sensor optimized to detect a non-zero AC component in the DC signal.

In addition to one or more of the features described above, or as an alternative, further embodiments may include wherein the current sensor comprises: a core with at least one air gap arranged to prevent saturation of the core; and a wire arranged around the core, wherein the wire has a resistance of 20 to 30 ohms In addition to one or more of the features described above, or as an alternative, further embodiments may include wherein: the wire is located on a printed circuit board (PCB).

In addition to one or more of the features described above, or as an alternative, further embodiments may include wherein: the core is selected from a ferrite, solid steel, or a laminated steel.

In addition to one or more of the features described above, or as an alternative, further embodiments may include: an AC power input; and a converter arranged to convert the AC power input to a DC power input.

In addition to one or more of the features described above, or as an alternative, further embodiments may include wherein: the AC power input is a three-phase power input.

Technical effects of embodiments of the disclosure include a system that reduces torque ripple by sensing an AC ripple in a DC power input and applying a correction that results in the reduction or elimination of torque ripple.

These and other advantages and features will become more apparent from the following description taken in conjunction with the drawings.

Additional features are realized through the techniques of the present disclosure. Other embodiments are described in detail herein and are considered a part of the claims. For a better understanding of the disclosure with the features, refer to the description and to the drawings.

BRIEF DESCRIPTION OF THE DRAWINGS

The subject matter which is regarded as the disclosure is particularly pointed out and distinctly claimed in the claims at the conclusion of the specification. The forgoing features are apparent from the following detailed description taken in conjunction with the accompanying drawings in which:

Figure 1:
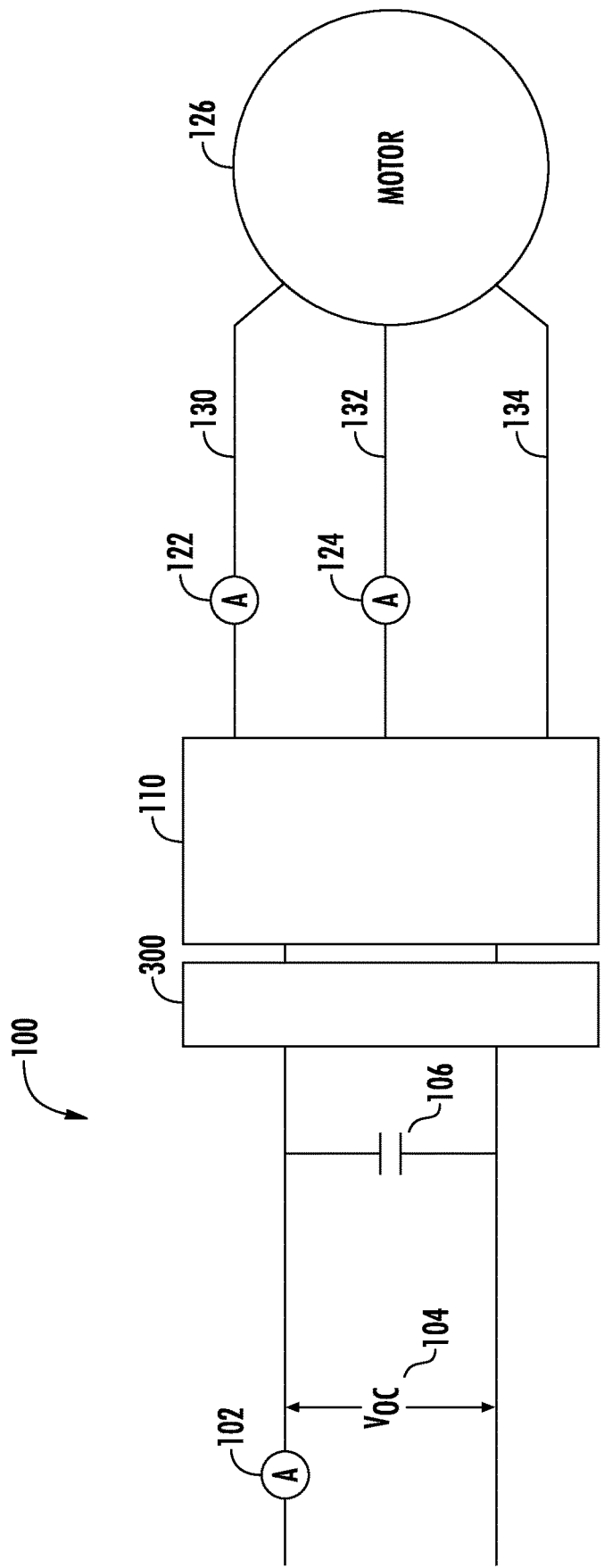
FIG. 1 is a diagram illustrating an embodiment with a non-regenerative or battery operated drive.

It should be understood that the drawings are not necessarily to scale and that the disclosed embodiments are sometimes illustrated diagrammatically and in partial views. In certain instances, details which are not necessary for an understanding of this disclosure or which render other details difficult to perceive may have been omitted. It should be understood that this disclosure is no limited to the particular embodiments illustrated herein.

DETAILED DESCRIPTION

Various embodiments will now be described with reference to the related drawings. Alternate embodiments may be devised without departing from the scope of this detailed description. Various connections might be set forth between elements in the following description and in the drawings. These connections, unless specified otherwise, may be direct or indirect, and the present description is not intended to be limiting in this respect. Accordingly, a coupling of entities may refer to either a direct or an indirect connection.

As described above, torque ripple can cause undesirable vibrations in objects being driven by an electric motor. This can be particularly troublesome when an electric motor is used in an environment in which mechanical resonances can be excited. One potential cause of torque ripple is errors in the current sensors being used in the system. Offset errors in the current sensors can cause a once per cycle torque ripple. If current sensors in different phases have amplitude errors, secondary harmonic errors can result.

Turning now to an overview of an embodiment, a closed-loop control method that can be used to reduce or eliminate motor torque ripple is described herein. DC bus harmonics are measured and used to reduce the torque ripple. The information used to reduce the torque ripple can include power or current or voltage information. The real-time DC bus harmonics information is collected for a discrete Fourier transform (DFT) analysis. The first, second, and sixth harmonics are calculated in the proper "windowing" time including output frequency range, current and power levels, and the like. Based on the results of the DFT, errors that are constant or slowly changing are derived and fed into appropriate formulas and into a closed control loop to be accounted for. All of the errors can be tracked during the drive's operation, regulating the motor torque ripple in real-time. The DC bus harmonics are AC components of a DC signal and can be sensed using a current sensor with high sensitivity to certain AC frequencies.

Turning now to a more detailed description of one or more embodiments, a diagram illustrating a non-regenerative/battery-operated drive application is presented in FIG. 1. FIG. 1 illustrates a system 100 that can be used in one or more embodiments. System 100 includes a direct current (DC) power that is input into an inverter 110. The DC power input has a voltage ($V_{dc}$) that can be measured at voltmeter 104 and a current ($I_{dc}$) that can be measured at current sensor 102. The input might also have a capacitance represented by capacitor 106.

The output of inverter 110 is a three-phase alternating current (AC) power including a first phase 130, a second phase 132, and a third phase 134. The AC current through each phase can be measured at current sensor 122 (designated as $I_u$) and current sensor 124 (designated as $I_v$) (if there were a third current sensor, it could be designated as $I_w$, where u, v, and w are the traditional labels for the phases in three-phase power). Because of the properties of three-phase power, only two current sensors are used in some embodiments because the current in the third phase can be calculated using the current in the two other phases (the sum of the current through all three phases in a three-phase system is always zero). The current is used to drive motor 126.

Figure 2:
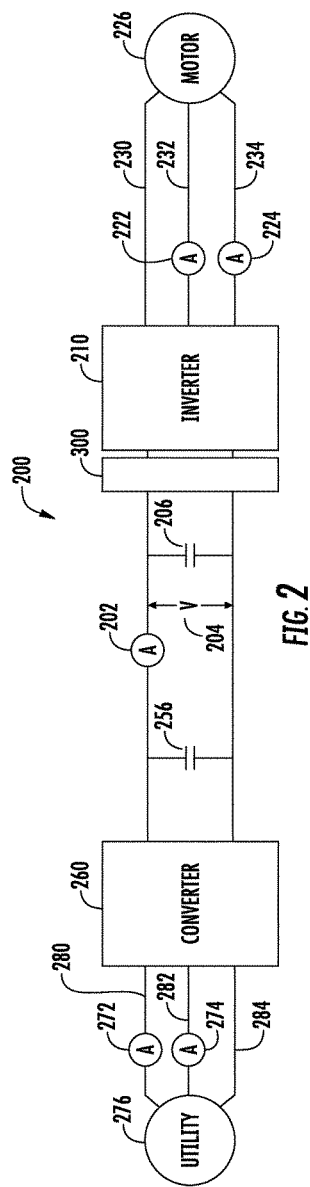
FIG. 2 is a diagram illustrating an embodiment with a regenerative drive.

Turning now to another embodiment, a diagram illustrating a regenerative drive application is presented in FIG. 2. In a regenerative drive embodiment, current generated by the motor can be supply power to the power grid. A regenerative drive can be used, for example, in an elevator configuration—when the elevator car is going in one direction, it is using power to drive the electric motor; when the elevator car is going in the opposite direction, it is supplying power to the power grid. One could view this situation as power always being supplied to an energy sink. In some instances, the energy sink is the motor 226 in that the motor is receiving the electric power. In some instances the energy sink is the power grid or utility 276, as the motor generates electricity and supplies the electricity to the power grid. Thus, it should be understood that flow of electricity in the system of FIG. 2 can travel in both directions.

FIG. 2 illustrates a system 200 that can be used in one or more embodiments. The right-hand portion of FIG. 2 is similar to that described above with respect to FIG. 1. System 200 includes power that is input into an inverter 210. The input has a voltage ($V_{dc}$) that can be measured at voltmeter 204 and a current ($I_{dc}$) that can be measured at current sensor 202. The input might also have a capacitance represented by capacitor 206.

The output of inverter 210 is a three-phase AC power including a first phase 230, a second phase 232, and a third phase 234. The current through each phase can be measured at current sensor 222 and current sensor 224. Because of the properties of three-phase power, only two current sensors are used in some embodiments, because the current in the third phase can be calculated using the current in the two other phases. To further illustrate this point, current sensors 222 and 224 are a different location than illustrated in FIG. 1, but the result of the two is the same. The current is used to drive motor 226.

The input to inverter 210 comes from utility 276. Utility 276 supplies three-phase power via connections 280, 282, and 284 to converter 260. The current through each phase can be measured by current sensors 272 (measuring $I_r$) and 274 (measuring $I_s$). As described above, the current through the third phase can be calculated based on the current through the other two phases. Converter 260 is configured to convert the AC power into DC power.

As discussed above, errors in the current sensors, such as elements 122, 124, 222, 224, 272 and 274, could lead to power ripple, which can be a cause of torque ripple. In the past, one solution to potential torque ripple problems is to use more accurate and more precise current sensors on all three or two output phases. This solution incurs additional costs. Another solution is to use an open-loop compensation for any such problem. However, that solution requires the errors to be known, which can be a problem because the errors in the current sensors can be affected by environment (such as temperature).

A solution can be to use a closed-loop compensation system. Current sensor 102 measures $I_{dc}$, the amount of DC bus current in the system. Thus, real power in the system is being measured. Power ripple on the DC bus leads to torque ripple in the motor. Because we are only looking for AC components out of the DC signals and eventually the AC signals is driven to be zero, it is not necessary to have a very precise measurement of current. Instead of using a very precise current sensor, one can use a current sensor of lesser precision, but high sensitivity to AC ripple.

Figure 3:
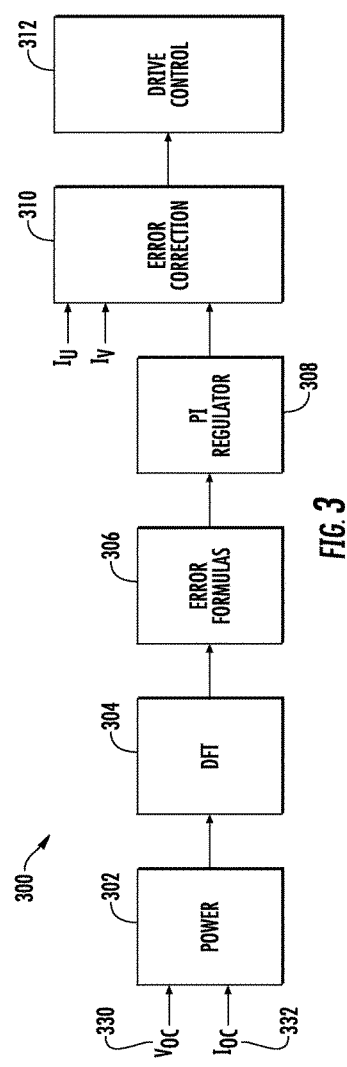
FIG. 3 is a block diagram illustrating the operation of an embodiment.

A diagram illustrating a closed-loop drive control system 300 is presented in FIG. 3. DC power is input into a power module 302. The DC power has a voltage $V_{DC}$ 330 and a current $I_{DC}$ 332. The data regarding the DC power input is input into a discrete Fourier transform (DFT) module 304. DFT module 304 is used to pull out the amplitude and phase components of the power on the bus at the frequency at which the motor is being operated (which can be a variable frequency in some embodiments.) The first harmonic is used to determine offset errors and second harmonic information is used to determine amplitude errors. There can be offset errors for each current sensor. Amplitude errors might not be precisely measured in order to determine a correction to be used to reduce torque ripple.

Error formulas are applied in error module 306. Error module 306 calculates a correction that can be used to correct any errors found in the DFT 304. A proportional-integral (PI) regulator 308 is part of the closed control loop, which attempts to drive the errors from 306 to be zero and eventually learns and tracks all the system errors (e.g., current sensor error, motor sensor error, and the like.) Error correction module 310 receives an input from both PI regulator 308 and the current from the three-phase power ($I_u$ and $I_v$). Taking into account $I_u$ and $I_v$ and the output of PI regulator 308, corrections are applied to drive control unit 312. In some embodiments, instead of using $I_u$ and $I_v$, the values of $I_r$ and $I_s$, can be used. In operation, drive control system 300 can be placed before inverter 110 (or 210), controlling the power supplied to motor 126 (or 226), as shown in both FIG. 1 and FIG. 2.

If torque ripple is present, then there is power or current ripple on the bus (found in power module 302). The output of DFT module 304 would be non-zero. The offset error is determined using first harmonic information from DFT module 304 and is calculated in error module 306. PI regulator 308 is set to a low-bandwidth. If correction are made at too high of a bandwidth, the result can be various problems that can be avoided by correcting at a lower frequency. In the event of an offset error, PI regulator 308 can be used to change a compensation amount used for one or more current sensors. This reduces the amount of first harmonic in the power or current, which reduces the torque ripple, which reduces the output of DFT module 304. Over time, the power ripple is driven closer and closer to zero, in turn reducing torque ripple.

In some embodiments, instead of measuring both current and voltage to determine power ripple, only the current ripple or only the voltage ripple might be measured and corrected to zero. Thus, only one parameter of the DC bus is being measured, the parameter being selected from the DC bus voltage or the DC bus current.

The estimated offset or amplitude error is input into the error correction module 310 along with $I_u$ and $I_v$. Corrections are applied to the values of $I_u$ and $I_v$ and provided to drive control 312.

Another potential cause of torque ripple is imperfections in the motor. The techniques described above can be used to correct for torque ripple found in the motor, including sixth harmonics caused by spatial harmonics in the manner in which the motor is wound.

In addition, embodiments described above can also correct errors in the input from the power supplies.

As discussed above, errors in current sensors, such as elements, 122, 124, 222, 224, 272, and 274, can be a cause of torque ripple. One solution to potential torque ripple problems that was used in the past is the use of more accurate and more precise current sensors. Another solution is to use an open-loop compensation for any such problem. However, that solution requires the errors to be known, which can be a problem because the errors in the current sensors can be affected by environment (such as temperature).

Figure 4:
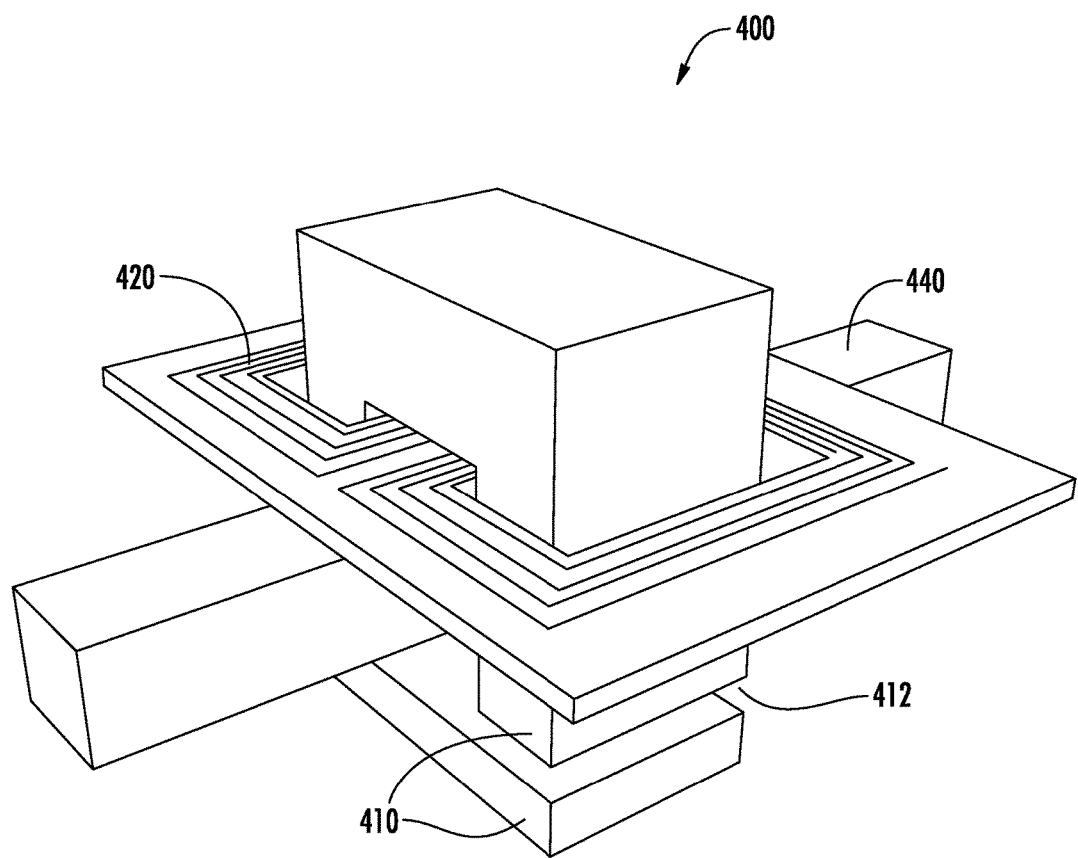
FIG. 4 illustrates a current sensor of an embodiment.

With reference to FIG. 4, a current sensor 400 that can be used in embodiments is described. As described above, the DC component of DC bus current is much higher than the harmonics or ripples, which makes traditional current sensors less attractive. For example, a Hall-effect current sensor is short of resolution on an AC ripple because its accuracy is wasted on the DC component. The sensitivity of a Rogowski coil is too low when the AC ripple is low compared to the DC component. One would need very high resolution, which can be difficult to achieve because of noise sensitivity and due to cost.

Current sensor 400 is a low-cost AC current sensor. Current sensor 400 need not be precise, just very sensitive in a certain area of interest. Current sensor 400 comprises a magnetic core 410, and a coil 420. In some embodiments, coil 420 is located on a printed circuit board (PCB) 422. In some embodiments, coil 420 has a relatively high resistance (in the range of 20 to 30 ohms in some embodiments), causing issues in certain frequency ranges that are not of interest. In some embodiments, there is not a large amount of material in coil 420. Magnetic core 410 can comprise one of a variety of different materials. Exemplary materials include ferrites, solid steel, laminated steel, and the like. A wide-variety of shapes can be used for magnetic core 410. Illustrated is a U-I shaped core, but other shapes can be used.

In some embodiments, PCB 422 might be just a portion of a larger PCB that performs many other functions. In some embodiments, coil 420 can be just a winding of wire without a PCB. An air gap 412 is present on magnetic core 410 to prevent the core from saturating at a high flux (e.g., when there is a high DC current flowing through bus bar 440). The air gap is relatively large compared to magnetic core 410. In some embodiments, the air gap might be approximately 4.0 mm, while the thickness of magnetic core 410 is approximately 3.2 mm. The length of the core may be in the range of 20 to 30 mm.

But the AC current will be detected and measured by coil 420. In some embodiments, two air gaps are present, though only one air gap is shown in FIG. 4. The current being measured is in bus bar 440. The resistance and the inductance of coil 420 encircling the legs of magnetic core 410 are specifically designed to achieve a proper cut-off frequency. Current sensor 400 is coupled to a signal conditioning circuit (not shown) to convert the secondary current signal to a voltage signal. In addition, the signal conditioning circuit can be used to further attenuate undesirable high-frequency noise. The final output voltage signal can be sent to an analog to digital converter (ADC) for current conversion.

There are several benefits of current sensor 400: it can be built for a low cost and is relatively easy to implement. In addition, there is no saturation problem in magnetic core 410 because of the presence of air gap 412. Current sensor 400 also has a high sensitivity and a high resolution in measuring a small AC ripple out of a large DC component. For example, there can be hundreds of amps of DC current present in some embodiments. There is also good signal integrity in low-frequency ranges.

Compared to other current sensors, current sensor 400 has the sensitivity of current transformer without saturation issues. In general, one might not want to have a large air gap because better coupling is desired in most use cases. In addition, the relatively high resistance of coil 420 is also unusual because a high resistance would normally be bad for sensitivity. One might want a higher performance core 410 to avoid core losses.

However, because current sensor is used in the system of FIGS. 1-3, current sensor 400 is placed on the DC bus, but the DC current being measure is irrelevant—one is only interested in the AC component. What is important is not the amplitude of the signal, but the fact that the amplitude is non-zero. Thus, the accuracy and precision of current sensor 400 can be sacrificed. The gap reduces DC flux, allowing one to use a much smaller core 410 than would normally be used.

From the foregoing, it can be seen that the torque ripple reduction system and method disclosed herein has industrial applicability in a variety of settings involving the use of electric motors. Using the teachings of the present disclosure, a torque ripple reduction system may be constructed to reduce torque ripple and smooth the performance of an electric motor. The reduction in torque ripple has many positive benefits, especially with respect to applications involving the transportation of humans, who will see a reduction in vibration, including mechanical resonances that can be excited by the presence of ripple in an electric motor.

Aspects of embodiments are described herein with reference to flowchart illustrations and/or block diagrams of methods, apparatus (systems), and computer program products according to embodiments. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description has been presented for purposes of illustration and description, but is not intended to be exhaustive or limited to the embodiments in the form described. Many modifications and variations will be apparent to those of ordinary skill in the art without departing from the scope and spirit of the description. The embodiment was chosen and described in order to best explain the operation and construction and the practical application, and to enable others of ordinary skill in the art to understand various embodiments with various modifications as are suited to the particular use contemplated.

What is claimed is:

1. A method comprising:
    sensing an electric parameter of an input electric signal;
    detecting a ripple in an AC component of the electric parameter;
    determining a correction to reduce the ripple in the AC component; and applying the correction to an electric signal supplied to an energy sink to reduce torque ripple; wherein:
detecting the ripple comprises using a discrete Fourier transform on the input electric signal to detect a non-zero result.

2. The method of claim 1 wherein the energy sink is chosen from an electric motor or a power grid.

3. The method of claim 1 wherein:
the electric parameter is chosen from current, voltage, or power.

4. The method of claim 1 further comprising:
analyzing the electric signal supplied to the energy sink to create a closed-loop control that reduces the ripple to zero.

5. The method of claim 4 wherein:
the electric signal supplied to the energy sink comprises a three-phase AC signal; and
analyzing the electric signal supplied to the energy motor comprises measuring current in at least two of the three-phases of the three-phase AC signal.

6. The method of claim 1 wherein:
the input electric signal is a DC electric signal; and
sensing the electric parameter comprises sensing an AC component in the DC electric signal.

7. The method of claim 6 wherein:
sensing the AC component in the DC signal comprises using a current sensor optimized to detect a non-zero AC component in the DC signal.

8. A system comprising:
a DC power input;
an inverter arranged to convert the DC power input to a three-phase AC power;
a drive control coupled to the inverter; and
an energy sink electric motor coupled to the drive control; wherein:
the drive control is arranged to perform:
sensing an electric parameter of the DC power input;
detecting a ripple in an AC component of the electric parameter;
determining a correction to reduce the ripple in the AC component; and
applying the correction to an electric signal supplied to the energy sink to reduce torque ripple; wherein:
detecting the ripple comprises using a discrete Fourier transform on the input electric signal to detect a non-zero result.

9. The system of claim 8 wherein:
the electric parameter is chosen from current, voltage, or power.

10. The system of claim 8 wherein the drive control is further arranged to perform:
analyzing the electric signal supplied to the energy sink electric motor to create a closed-loop control that reduces the ripple to zero.

11. The system of claim 10 wherein:
the electric signal supplied to the energy sink comprises a three-phase AC signal; and
the analyzing the electric signal supplied to the energy sink comprises measuring current in at least two of the three-phases of the three-phase AC signal.

12. The system of claim 8 wherein:
the input electric signal is a DC electric signal;
the sensing the electric parameter comprises sensing an AC component in the DC electric signal.

13. The system of claim 12 wherein:
the sensing the AC component in the DC signal comprises using a current sensor optimized to detect a non-zero AC component in the DC signal.

14. The system of claim 12 wherein the current sensor comprises:
a core with at least one air gap arranged to prevent saturation of the core; and
a wire arranged around the core, wherein the wire has a resistance of 20 to 30 ohms.

15. The system of claim 14 wherein:
the wire is located on a printed circuit board (PCB).

16. The system of claim 14 wherein:
the core is selected from a ferrite, solid steel, or a laminated steel.

17. The system of claim 8 further comprising:
an AC power input; and
a converter arranged to convert the AC power input to a DC power input.

18. The system of claim 8 wherein:
the energy sink is chosen from an electric motor or a power grid.

* * * * *